United States Patent
Kinouchi et al.

(10) Patent No.: US 9,236,529 B2
(45) Date of Patent: Jan. 12, 2016

(54) SEMICONDUCTOR LIGHT EMITTING ELEMENT HAVING SEMICONDUCTOR STRUCTURE WITH PROTRUSIONS AND/OR RECESSES

(71) Applicant: Nichia Corporation, Anan-shi (JP)

(72) Inventors: Akiyoshi Kinouchi, Komatsushima (JP); Ryohei Hirose, Anan (JP); Hirofumi Nogami, Katsuura-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/447,194

(22) Filed: Jul. 30, 2014

(65) Prior Publication Data

US 2015/0034963 A1 Feb. 5, 2015

(30) Foreign Application Priority Data

Jul. 30, 2013 (JP) .................................. 2013-157541

(51) Int. Cl.
| | |
|---|---|
| *H01L 33/00* | (2010.01) |
| *H01L 51/52* | (2006.01) |
| *H01L 33/20* | (2010.01) |
| *H01L 33/46* | (2010.01) |
| *H01L 33/60* | (2010.01) |
| *H01L 33/32* | (2010.01) |
| *H01L 33/40* | (2010.01) |
| *H01L 33/22* | (2010.01) |

(52) U.S. Cl.
CPC ................ *H01L 33/20* (2013.01); *H01L 33/46* (2013.01); *H01L 33/0025* (2013.01); *H01L 33/22* (2013.01); *H01L 33/32* (2013.01); *H01L 33/40* (2013.01); *H01L 33/60* (2013.01); *H01L 51/5268* (2013.01)

(58) Field of Classification Search
CPC ..... H01L 33/60; H01L 33/0025; H01L 33/32; H01L 33/40; H01L 33/22; H01L 51/5268
See application file for complete search history.

(56) References Cited

U.S. PATENT DOCUMENTS

| | | | |
|---|---|---|---|
| 6,229,160 B1 | 5/2001 | Krames et al. | |
| 6,531,405 B1* | 3/2003 | Wegleiter et al. | 438/745 |
| 7,183,586 B2* | 2/2007 | Ichihara | H01L 33/32 257/95 |
| 7,667,224 B2* | 2/2010 | Ohashi et al. | 257/13 |
| 8,525,204 B2* | 9/2013 | Fukshima et al. | 257/98 |
| 8,653,552 B2* | 2/2014 | Kazama | 257/98 |
| 2004/0026700 A1* | 2/2004 | Akaike | H01L 33/20 257/79 |
| 2006/0204865 A1* | 9/2006 | Erchak et al. | 430/7 |

(Continued)

FOREIGN PATENT DOCUMENTS

| | | | |
|---|---|---|---|
| JP | H-10-341035 A | 12/1998 | |
| JP | 2004-056109 A | 2/2004 | |

(Continued)

*Primary Examiner* — Ida M Soward
(74) *Attorney, Agent, or Firm* — Foley & Lardner LLP

(57) ABSTRACT

A semiconductor light emitting element in which changes in light distribution characteristics due to inclination angle of side surfaces are suppressed. The semiconductor light emitting element includes a semiconductor structure having a light extracting surface as its upper surface; a reflecting layer disposed on side surfaces of the semiconductor structure; and a positive electrode and a negative electrode disposed on a lower surface of the semiconductor structure. Side surfaces of the semiconductor structure are inclined, expanding upward from the lower surface to the upper surface. At least a portion of each side surface includes a plurality of protrusions, a plurality of recesses, or a combination thereof.

21 Claims, 3 Drawing Sheets

(56) References Cited

U.S. PATENT DOCUMENTS

| | | | |
|---|---|---|---|
| 2008/0315232 A1* | 12/2008 | Matsuo et al. | 257/98 |
| 2009/0085050 A1* | 4/2009 | Guo et al. | 257/98 |
| 2011/0284894 A1 | 11/2011 | Beom et al. | |
| 2012/0267656 A1* | 10/2012 | Kuo et al. | 257/98 |
| 2013/0193467 A1 | 8/2013 | Kususe et al. | |
| 2013/0193478 A1* | 8/2013 | Shinohara et al. | 257/103 |
| 2015/0084537 A1* | 3/2015 | Choi | H01L 33/20 315/250 |
| 2015/0129915 A1* | 5/2015 | Lee et al. | 257/98 |

FOREIGN PATENT DOCUMENTS

| | | |
|---|---|---|
| JP | 2005-039264 A | 2/2005 |
| JP | 2005-039284 A | 2/2005 |
| JP | 2006-012916 A | 1/2006 |
| JP | 2011-249805 A | 12/2011 |
| WO | WO-2004/013916 A | 2/2004 |

\* cited by examiner

SEMICONDUCTOR LIGHT EMITTING ELEMENT HAVING SEMICONDUCTOR STRUCTURE WITH PROTRUSIONS AND/OR RECESSES

CROSS-REFERENCE TO RELATED APPLICATIONS

This application claims priority to Japanese Patent Application No. 2013-157541, filed on Jul. 30, 2013, which is hereby incorporated by reference in its entirety.

BACKGROUND

1. Technical Field

The present disclosure relates to a semiconductor light emitting element applicable for displays, etc.

2. Background Art

A light emitting element such as that described in JP 2002-26382A has a shape in which the side surfaces of the light emitting element are extending in the light extracting direction, and a light reflecting portion made of a light reflecting material is closely adhered to the side surfaces of the light emitting element to be unified with the light emitting element (see FIG. 4 of JP 2002-26382A).

In the light emitting element such as that described in JP 2002-26382A, a change in the inclination angle (an angle between the lower surface and a side surface) of one or more side surfaces of the light emitting element due to manufacturing variation may result in a change in the light distribution characteristics.

Embodiments of the present invention are devised to solve the above-described problems, and are aimed to provide a semiconductor light emitting element in which the light distributing properties is barely subjected to a change in the inclination angle of one or more side surfaces of the semiconductor light emitting element.

SUMMARY

A semiconductor light emitting element according to the embodiments of the present invention includes a semiconductor structure having a light extracting surface as an upper surface, a reflecting layer disposed on side surfaces of the semiconductor structure, and a positive electrode and a negative electrode which are disposed on a lower surface of the semiconductor structure. Particularly, the side surfaces of the semiconductor structure are inclined expanding upward from the lower surface to the upper surface, and at least a region of each side surface has a plurality of protrusions or recesses or both.

Embodiments of the present invention can provide a semiconductor light emitting element in which the light distributing properties is barely subjected to a change in the inclination angle of the side surfaces of the semiconductor light emitting elements.

DETAILED DESCRIPTION OF THE EMBODIMENTS

Figure 1:
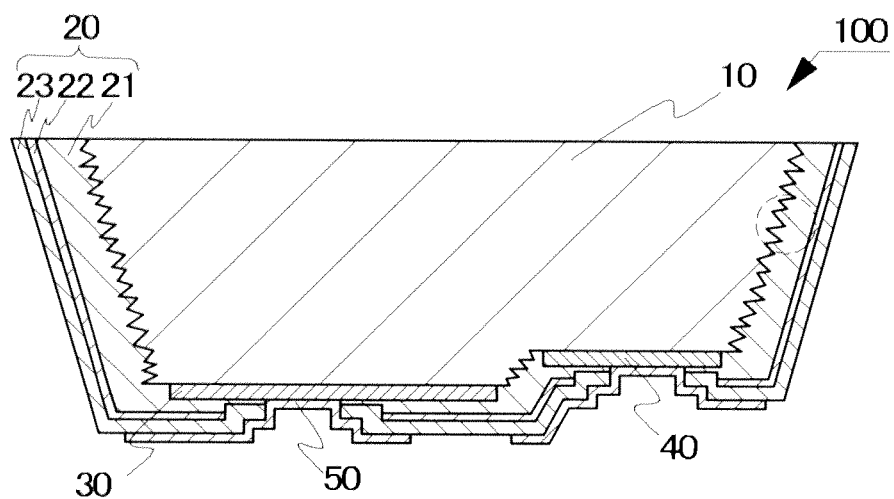
FIG. 1 is a schematic cross-sectional view illustrating a semiconductor light emitting element according to a first embodiment, taken along the line X in FIG. 2.

Embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

First Embodiment

Figure 2:
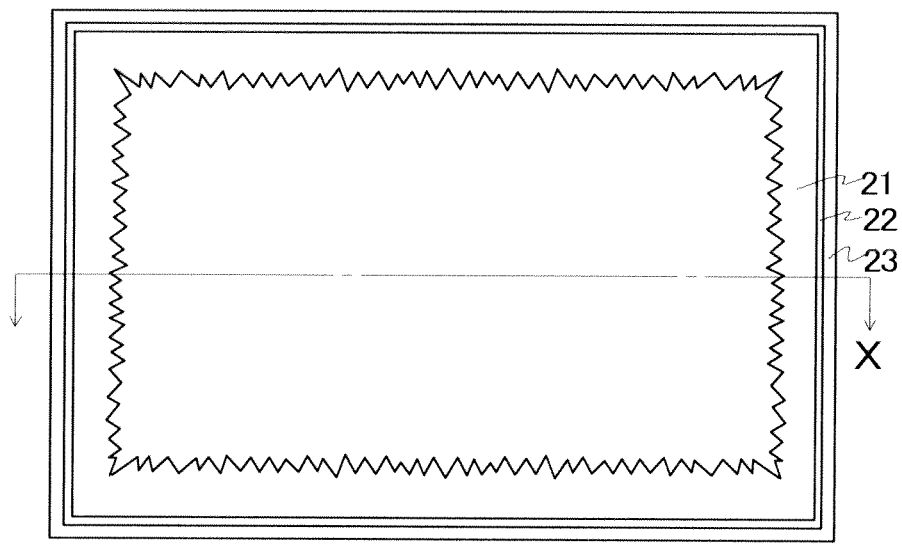
FIG. 2 is a schematic plan view of the semiconductor light emitting element shown in FIG. 1, seen from the light extracting surface side.
Figure 3:
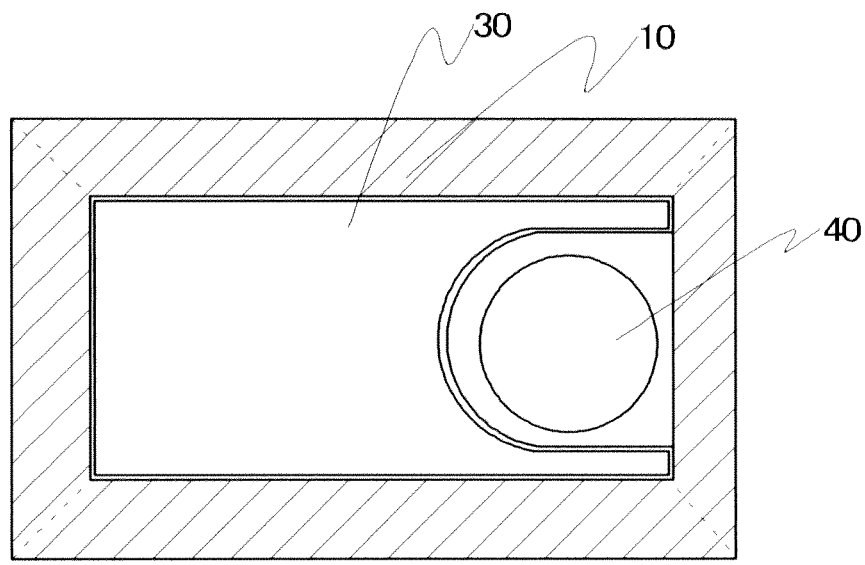
FIG. 3 is a schematic plan view of the semiconductor light emitting element shown in FIG. 1, seen from its positive electrode and negative electrode side.
Figure 4:
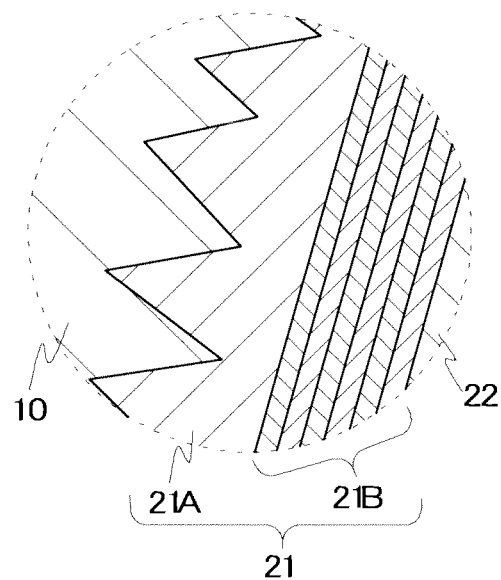
FIG. 4 is a partially enlarged view of an area encircled by the broken line in FIG. 1.

FIG. 1 shows a schematic cross-sectional view of the semiconductor light emitting element 100 according to the present embodiment, taken along the line X in FIG. 2. FIG. 2 is a schematic plan view of the semiconductor light emitting element 100, seen from the upper, light extracting surface, which is the light extracting surface. Further, FIG. 3 is a schematic plan view of the semiconductor light emitting element 100, seen from the lower surface. FIG. 3 is for illustrating a positional relationship between the semiconductor structure 10 and the positive electrode 30 and the negative electrode 40, and thus the reflecting layer 20 and the pad electrode 50 are not shown. Also, in FIG. 3, the region where a plurality of protrusions is formed is shown by hatching. FIG. 4 is a partially enlarged view of an area encircled by the broken line in FIG. 1.

The semiconductor light emitting element 100 includes a semiconductor structure 10 having an upper surface, which is the light extracting surface, a reflecting layer 20 disposed on side surfaces of the semiconductor structure 10, and a positive electrode 30 and a negative electrode 40 which are disposed on a lower surface of the semiconductor structure 10. Specifically, the side surfaces of the semiconductor structure 10 are inclined, expanding upward from the lower surface to the upper surface, and have a plurality of protrusions.

With this arrangement, even in the case where the inclination angle of the side surfaces of the semiconductor structure 10 differs between individual light emitting elements due to manufacturing irregularities, variation in the light distributing properties between the light emitting elements may be prevented. More specifically, generally on the side surfaces of the semiconductor structure 10, light is reflected to upward by the reflecting layer 20, but with the plurality of protrusions which are formed on the side surfaces, the light can also be scattered. That is, in the case where the side surfaces are flat, the direction of the reflected light is determined to some degree by the inclination angle of the side surfaces, but roughening the side surfaces allows for scattering the light, which can prevent the optical intensity from being concentrated in a specific direction. As a result, stable light distribution that barely depends on the inclination angle of the side surfaces can be obtained.

The main members used in the light emitting element 100 will be described below. For the semiconductor light emitting element 100, an LED (light emitting diode) can be used.

Semiconductor Structure 10

The semiconductor structure 10 may include, for example, from the lower side to the upper side (from the bottom side toward the top side in FIG. 1), a first conductive-type (a p-type semiconductor) layer, an active layer, and a second conductive-type (an n-type semiconductor) layer in this order. In this case, an upper surface of the semiconductor structure 10, that is, the upper surface of the second conductive-type layer serves as the light extracting surface. For the semiconductor structure 10, for example, a stacked layer of a plurality of GaN-based semiconductors (GaN, AlGaN, InGaN, and the like) can be used, which allows for an emission color of, for example, blue or green. As shown in FIG. 2, in a top view, the planar shape of the semiconductor structure 10 of the semiconductor light emitting element 100, at a surface provided with the protrusions (and/or recesses), which is a surface including a base-end of each of the protrusions and/or recesses or a surface including a portion in the vicinity of a base-end of each of the protrusions and/or recesses, is a rectangular shape. However, a square shape, for example, may also be employed.

The semiconductor structure 10 has side surfaces that expand toward upper surfaces from respective lower surfaces, and thus the side surfaces are inclined. That is, the side surfaces of the semiconductor structure 10 have a shape gradually expanding outward. Also, a reflecting layer 20 is disposed on the side surfaces of the semiconductor structure 10. Thus, the reflecting layer 20 is also expanded upwardly in conformation to each side surface. With the reflecting layers 20 that incline as described above, light can be efficiently reflected upward.

The inclination angle of the semiconductor structure 10 is preferably 91° or greater and 135° or less, more preferably 98° or greater and 120° or less, further preferably 102° or greater and 108° or less. With this arrangement, light can be reflected upward. The term "inclination angle" used in the specification refers to an angle between the lower surface and one of the side surfaces (the surface that includes the base-end of each protrusion or its vicinity).

In the present embodiment, a plurality of protrusions is formed on the side surfaces of the semiconductor structure 10. That is, the side surfaces of the semiconductor structure 10 are roughened. With this arrangement, light can be irregularly reflected at the side surfaces of the semiconductor structure 10. In the case where four side surfaces are employed, protrusions can be formed on the whole area of one side surface, or on a partial region of one side surface. For maximally suppressing a change in the light distributing properties, the protrusions are preferably formed on the whole area of all the side surfaces as in the present embodiment. Of course, instead of a plurality of protrusions, a plurality of recesses or a plurality of protrusions and recesses may be formed on the side surfaces of the semiconductor structure 10.

In the specification, the term "protrusion" includes a protrusion having a pointed tip at the top, a protrusion having a flat top, a protrusion having a curved top, etc. Also, the term "recess" includes a recess having a pointed tip at the bottom, a recess having a flat bottom, a recess having a curved bottom, etc. The size and the shape of the protrusions and recesses may either be substantially uniform or irregular. In the semiconductor light emitting element 100, the protrusions are formed on all regions except for the lower surface and the upper surface of the semiconductor structure 10. For example, as shown in FIG. 1, the protrusions are also formed on the surface (side surfaces at the step portion) which connects the surface for disposing the positive electrode 30 and the surface for disposing the negative electrode 40.

The base-ends of the protrusions can be arranged adjacent to the base-ends of adjacent protrusions respectively. That is, the protrusions can be formed so as not to have a flat surface between adjacent protrusions respectively. In the case where a plurality of recesses is formed, in a similar manner as in the protrusions, the base-ends of the recesses can be arranged adjacent to the base-ends of adjacent recesses respectively. As described above, reducing a flat surface and forming the protrusions and/or the recesses at a high density allows for facilitating occurrence of irregular reflection.

The height of the protrusions (the depth of the recesses) may be preferably 0.1 nm or greater and 15 nm or less, more preferably 1 nm or greater and 5 nm or less. With the height of the protrusions above a certain value, the effect of irregularly reflecting light can be sufficiently obtained. Also, with the height of the protrusions below a certain value, formation of a plurality of protrusions on the side surfaces can be facilitated.

The protrusions and/or the recesses on the semiconductor structure 10 can be formed by way of dry etching or wet etching which may be performed after forming the side surfaces into inclined (sloped) surfaces by way of etching etc. and before forming the reflecting layer 20. In view of mass productivity, wet etching may be preferably employed. In the case of a GaN-based semiconductor, a solution employed in wet etching may be an aqueous solution of KOH, tetramethylammonium hydroxide, ethylenediamine pyro chatechol, or the like, and among those, an aqueous solution of tetramethylammonium hydroxide may be preferably used.

A plurality of protrusions is formed on the whole area of the side surfaces of the semiconductor structure 10. Further, the ratio of the total area of all side surfaces with respect to the area of the upper surface of the semiconductor structure 10 (that is, the sum of the area of each roughened surface shown in FIG. 1 and FIG. 2) can be increased. For example, the total area of the side surfaces can be arranged 1.0 to 2.0 times, more preferably 1.2 to 1.8 times, further preferably 1.3 to 1.7 times greater than the area of the upper surface of the semiconductor structure 10. Arranging the total area of the side surfaces to be greater than the area of the upper surface allows a greater ratio of the surfaces for diffusely reflecting light with respect to the light extracting surface, so that the effects of the above-mentioned embodiments of the present invention can be more remarkably attained. In the present specification, the term "side surface" indicates the surface on which the protrusions are formed and does not indicate the surfaces which include the surfaces of the protrusions (recesses) themselves. More specifically, a single surface which includes the base-edges of the protrusions or recesses or a single surface which includes a portion in the vicinity of a base edge of each of the protrusions or recesses is indicated as a "side surface". The term "upper surface" in Second embodiment is also indicated in a similar manner.

A protective layer made of silicon oxide, silicon nitride, or the like may be formed on the upper surface of the semiconductor structure 10.

Positive Electrode 30 and Negative Electrode 40

The positive electrode 30 is formed on the p-type semiconductor layer, and for example, indium tin oxide, zinc oxide, indium oxide, tin oxide, silver, titanium, rhodium, aluminum, chromium, etc., can be used, in which indium tin oxide is preferable. With the use of such a material, good ohmic contact with an abutting member can be obtained.

The negative electrode 40 is formed on the n-type semiconductor layer, and either the same material or a different material as the positive electrode 30 can be used. As shown in FIG. 2 and FIG. 3, the positive electrode 30 and the negative electrode 40 are disposed on the lower surface of the semiconductor structure 10 so that the entire upper surface of the semiconductor structure 10 can serve as the light extracting surface. Accordingly, the light extracting efficiency can be improved.

Reflecting Layer 20

The reflecting layer 20 serves to reflect light and may include, for example, an insulating layer 21 (first insulating layer 21) and a metal layer 22 in this order from the side surface side of the semiconductor structure 10. The reflecting layer 20 reflects light which is traveling toward the side surfaces of the semiconductor structure 10 to the light extracting surface side and provided on the entire area of each side surface. In order to improve the light extracting efficiency, the reflecting layer 20 can be also provided on the lower surface in addition to the side surfaces. In this case, the positive electrode 30 and the negative electrode 40 can be connected to the semiconductor structure at an opening defined in the reflecting layer 20. In the present embodiment, the insulating layer 21 and a metal layer 22 are disposed in this order as the reflecting layer 20, but a first insulating layer 21 may be used singly, or a different structure may be employed for the reflecting layer 20.

As shown in FIG. 4, the first insulating layer 21 may include in order from the semiconductor structure side, a first layer 21A, which may be a relatively thick single layer, and a second layer 21B, which may be a dielectric multilayer film, such as a Distributed Bragg Reflector (DBR), made of relatively thin layers.

For the first layer 21A, an insulating material which has a refractive index smaller than that of a GaN-based semiconductor can be used. For example, silicon oxide, niobium oxide, etc., can be used for the first layer 21A. The first layer 21A may have a thickness of 200 nm or greater and 500 nm or less, preferably 250 nm or greater and 350 nm or less. With the thickness of the first layer 21A above a certain level, light incident with a shallow angle can be totally reflected. Also, with the thickness of the first layer 21A below a certain value, absorption of light by the first layer 21A can be prevented and the effect of reflection by the second layer 21B can be maximally attained.

The second layer 21B may be a DBR and may be made of a multilayer of a combination of layers of a low refractive index material and a high refractive index material. For each layer constituting the dielectric multilayer, silicon oxide, niobium oxide, aluminum oxide, zirconium oxide, aluminum nitride, silicon nitride, or the like can be used. For the second layer 21B, for example, two or more pairs of combination of silicon oxide/niobium oxide, silicon oxide/zirconium oxide, silicon oxide/aluminum nitride, or the like, are preferably stacked. With this arrangement, the light incident to the second layer 21B in a perpendicular direction can be reflected. The thickness of members which constitute each layer of the second layer 21B may differ according to the material of each layer, and for example, a thickness of 50 nm or greater and 200 nm or less, preferably 50 nm or greater and 100 nm or less can be employed.

In the case where a first insulating layer 21 is employed as the reflecting layer 20, a metal layer 22 can be disposed on the outer side of the first insulating layer 21. With this arrangement, light which cannot be reflected by the first insulating layer 21 can be reflected by the metal layer 22. Thus, light can be reflected without loss by the reflecting layer as a whole. For the metal layer 22, for example, at least one metal selected from titanium, aluminum, silver, platinum, and rhodium can be included. Among those, titanium or aluminum is preferably included. The metal layer 22 may have a thickness of 60 nm or greater and 300 nm or less, preferably 150 nm or greater and 200 nm or less. With this arrangement, sufficient reflectance can be realized.

Also, as a part of the reflecting layer 20, a second insulating layer 23 can be disposed to cover the metal layer 22. The second insulating layer 23 serves as a protective layer for the metal layer 22, and for example, silicon oxide, silicon nitride, or the like can be used. With this arrangement, metal can be prevented from being exposed at the outermost surface of the semiconductor light emitting element 100, so that a semiconductor light emitting element 100 of high reliability which does not generate current leakage can be obtained. The second insulating layer 23 may have a thickness of 50 nm or greater and 600 nm or less, preferably 100 nm or greater and 400 nm or less.

Pad Electrode 50

The pad electrode 50 is, for example, preferably made of a metal, an alloy, or an oxide thereof, which contains at least one element selected from the group consisting of zinc, nickel, platinum, palladium, rhodium, ruthenium, osmium, iridium, titanium, zirconium, hafnium, vanadium, niobium, tantalum, cobalt, iron, manganese, molybdenum, chromium, tungsten, lanthanum, copper, silver, gold, and yttrium. More specifically, titanium/rhodium/gold/titanium from the semiconductor structure side can be employed.

Second Embodiment

Figure 5:
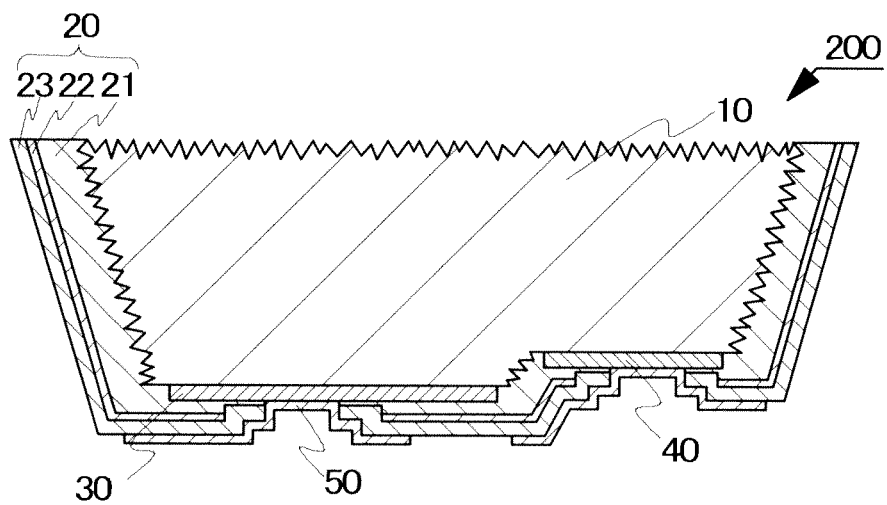
FIG. 5 is a schematic cross-sectional view illustrating a semiconductor light emitting element according to a second embodiment.

FIG. 5 shows a schematic cross-sectional view of the semiconductor light emitting element 200 according to the second embodiment. The semiconductor light emitting element 200 has substantially similar features as described in first embodiment except for the features to be described below.

In the semiconductor light emitting element 200, a plurality of protrusions is formed on the upper surface in addition to the side surfaces of the semiconductor structure 10. That is, the upper surface is also roughened. With this arrangement, light can also be scattered at the upper surface, so that the effect of suppressing a change in the light distributing properties associating with a change in the inclination angle can be more clearly obtained. Instead of a plurality of protrusions, a plurality of recesses, or a plurality of protrusions and recesses can be formed as described in first embodiment.

The protrusions and/or the recesses on the semiconductor structure 10 can be formed by way of dry etching or wet etching which may be performed after forming the reflecting layer 20. The semiconductor light emitting element 200 does not include a growth substrate for growing the semiconductor layers, and the upper surface itself of the semiconductor structure 10 is roughened.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor light emitting element comprising:
   a semiconductor structure having a light extracting surface as its upper surface, the semiconductor structure including an active layer;
   a reflecting layer disposed on side surfaces of the semiconductor structure; and a positive electrode and a negative electrode disposed on a lower surface of the semiconductor structure;

wherein the side surfaces of the semiconductor structure are inclined, expanding upward from the lower surface to the upper surface, and wherein the side surfaces of the semiconductor structure, including side surfaces of the active layer, include a plurality of protrusions, a plurality of recesses, or a combination thereof.

2. The semiconductor light emitting element according to claim 1, wherein at least a portion of the upper surface of the semiconductor structure also includes a plurality of protrusions, a plurality of recesses, or a combination thereof.

3. The semiconductor light emitting element according to claim 1, wherein a total area of the side surfaces of the semiconductor structure is 1.0 to 2.0 times larger than an area of the upper surface of the semiconductor structure.

4. The semiconductor light emitting element according to claim 2, wherein a total area of the side surfaces of the semiconductor structure is 1.0 to 2.0 times larger than an area of the upper surface of the semiconductor structure.

5. The semiconductor light emitting element according to claim 1, wherein the reflecting layer includes an insulating layer and a metal layer disposed in that order from the side surface side of the semiconductor structure.

6. The semiconductor light emitting element according to claim 2, wherein the reflecting layer includes an insulating layer and a metal layer disposed in that order from the side surface side of the semiconductor structure.

7. The semiconductor light emitting element according to claim 3, wherein the reflecting layer includes an insulating layer and a metal layer disposed in that order from the side surface side of the semiconductor structure.

8. The semiconductor light emitting element according to claim 5, wherein the insulating layer includes a dielectric multilayer film.

9. The semiconductor light emitting element according to claim 5, wherein the metal layer includes at least one metal selected from titanium, aluminum, rhodium, platinum, and silver.

10. The semiconductor light emitting element according to claim 5, wherein the insulating layer includes a first layer, which is a single layer, and a second layer, which is a dielectric multilayer film, disposed in that order from the semiconductor structure side.

11. The semiconductor light emitting element according to claim 1, wherein the semiconductor structure is a stacked layer of a plurality of GaN-based semiconductors.

12. The semiconductor light emitting element according to claim 1, wherein an inclination angle of the side surfaces of the semiconductor structure is 91° or greater and 135° or less.

13. The semiconductor light emitting element according to claim 1, wherein a height of the protrusions or the depth of the recesses is 0.1 nm or greater and 15 nm or less.

14. The semiconductor light emitting element according to claim 2, wherein a height of the protrusions or the depth of the recesses is 0.1 nm or greater and 15 nm or less.

15. The semiconductor light emitting element according to claim 1, wherein the positive electrode includes indium tin oxide, zinc oxide, indium oxide, tin oxide, silver, titanium, rhodium, aluminum or chromium.

16. The semiconductor light emitting element according to claim 10, wherein the first layer has a thickness of 200 nm or greater and 500 nm or less.

17. The semiconductor light emitting element according to claim 8, wherein the dielectric multilayer film has a thickness of 50 nm or greater and 200 nm or less.

18. The semiconductor light emitting element according to claim 1, wherein the protrusions or the recesses are formed by way of wet etching.

19. The semiconductor light emitting element according to claim 8, wherein the metal layer has a thickness of 60 nm or greater and 300 nm or less.

20. The semiconductor light emitting element according to claim 1, wherein said plurality of protrusions, plurality of recesses, or a combination thereof, extend along an entirety of the side surfaces of the semiconductor structure.

21. A semiconductor light emitting element comprising:
a semiconductor structure having a light extracting surface as its upper surface;
a reflecting layer disposed on side surfaces of the semiconductor structure; and
a positive electrode and a negative electrode disposed on a lower surface of the semiconductor structure;
wherein the side surfaces of the semiconductor structure are inclined, expanding upward from the lower surface to the upper surface,
wherein at least a portion of each side surface includes a plurality of protrusions, a plurality of recesses, or a combination thereof, and
wherein the reflecting layer includes an insulating layer and a metal layer disposed in that order from the side surface side of the semiconductor structure.

* * * * *